(12) United States Patent
Son

(10) Patent No.: US 11,528,831 B2
(45) Date of Patent: Dec. 13, 2022

(54) DISPLAY APPARATUS

(71) Applicant: LG DISPLAY CO., LTD., Seoul (KR)

(72) Inventor: Sung-Sik Son, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 17/133,169

(22) Filed: Dec. 23, 2020

(65) Prior Publication Data

US 2021/0204454 A1    Jul. 1, 2021

(30) Foreign Application Priority Data

Dec. 31, 2019   (KR) .......................... 10-2019-0179311

(51) Int. Cl.
*H05K 7/20* (2006.01)
*H01L 27/32* (2006.01)
*H01L 51/52* (2006.01)

(52) U.S. Cl.
CPC ....... *H05K 7/20963* (2013.01); *H01L 27/323* (2013.01); *H01L 27/3244* (2013.01); *H01L 51/529* (2013.01); *H01L 51/5253* (2013.01); *H01L 51/5281* (2013.01)

(58) Field of Classification Search
CPC ................................................. H05K 7/20963
See application file for complete search history.

(56) References Cited

U.S. PATENT DOCUMENTS

| 6,256,193 | B1 * | 7/2001 | Janik ..................... G06F 1/1669 |
| | | | 248/922 |
| 8,456,069 | B2 | 6/2013 | Lee et al. |
| 2005/0124221 | A1 * | 6/2005 | Lin .................... H05K 7/20972 |
| | | | 439/620.01 |
| 2007/0127208 | A1 | 6/2007 | Shin |
| 2007/0195494 | A1 | 8/2007 | Miyoshi et al. |
| 2010/0149765 | A1 | 6/2010 | Song |
| 2010/0156856 | A1 | 6/2010 | Lee et al. |
| 2014/0152906 | A1 * | 6/2014 | Yokawa ............. H05K 7/20963 |
| | | | 362/373 |
| 2016/0286099 | A1 * | 9/2016 | Godil ..................... B23P 15/26 |

FOREIGN PATENT DOCUMENTS

| KR | 10-1303055 B1 | 9/2013 |
| KR | 10-20150043918 A | 4/2015 |
| KR | 10-2016-0029945 A | 3/2016 |
| WO | 2012164941 A1 | 12/2012 |

OTHER PUBLICATIONS

Extended European Search Report dated May 25, 2021, issued in corresponding European Patent Application No. 20217550.1.

* cited by examiner

*Primary Examiner* — Mukundbhai G Patel

(74) *Attorney, Agent, or Firm* — Morgan, Lewis & Bockius LLP

(57) ABSTRACT

A display apparatus includes a heat dissipation sheet and a first plate disposed on the rear surface of a display panel, a printed circuit board disposed on one surface of the first plate, a component disposed on one surface of the printed circuit board, and a second plate disposed adjacent to the first plate. The first plate includes a bent extended portion and a coupling portion, and the bent extended portion is not in contact with the heat dissipation sheet.

15 Claims, 8 Drawing Sheets

| | | EXPERIMENTAL EXAMPLE | EMBODIMENT 1 | EMBODIMENT 2 |
|---|---|---|---|---|
| CG FRONT-SURFACE CONTACT-TYPE TEMPERATURE MEASUREMENT (°C) | A | 43.97 | 43.38 | 42.41 |
| | B | 43.87 | 43.87 | 44.14 |
| | C | 41.79 | 41.83 | 42.10 |
| CG MAX. TEMPERATURE (°C) | | 45.52 | 44.88 | 44.21 |
| MAX. TEMPERATURE DIFF. | | - | -0.64 | -1.31 |

DISPLAY APPARATUS

This application claims the benefit of Korean Patent Application No. 10-2019-0179311, filed on Dec. 31, 2019, which is hereby incorporated by reference as if fully set forth herein.

BACKGROUND

Technical Field

The present disclosure relates to a display apparatus, and more particularly, to a display apparatus in which a display panel is bendable.

Discussion of the Related Art

Recently, with the arrival of the information age, the field of displays for visually displaying electrically conveyed information signals has rapidly developed. In response thereto, various kinds of display apparatuses having excellent characteristics, such as a small thickness, low weight, and low power consumption, have been developed.

Representative examples of such display apparatuses include a liquid crystal display (LCD) apparatus, an organic light-emitting display (OLED) apparatus, and a quantum dot display apparatus.

Among these, a self-illuminating display apparatus, such as an organic light-emitting display apparatus, is considered a competitive application because it does not require a separate light source and enables the realization of a compact apparatus design and vivid color display. A display apparatus includes a self-illuminating element, which is provided in each subpixel. The light-emitting element includes two electrodes, which are opposite each other, and a light-emitting layer, which is disposed between the two electrodes and emits light when electrons and holes, which are transported, are recombined with each other. In addition, the display apparatus may include a display panel and multiple components for providing various functions. For example, one or more display-driving circuits for controlling a display panel may be included in a display assembly. Examples of the driving circuits include gate drivers, emission (source) drivers, power (VDD) routing, electrostatic discharge (ESD) circuits, multiplex (MUX) circuits, data signal lines, cathode contacts, and other functional elements. A number of peripheral circuits for providing various extra functions, such as touch-sensing or fingerprint identification functions, may be included in the display assembly. Some of the components may be disposed on the display panel, or may be disposed on a film or a printed circuit board that is disposed outside the display panel.

An organic light-emitting diode is a self-illuminating element that uses a thin light-emitting layer between electrodes, and thus has an advantage of realization of a small thickness. In addition, since an organic light-emitting diode is implemented without a separate light source, a flexible, bendable, or foldable display apparatus may be easily implemented using the organic light-emitting diode, and may further be formed in various designs.

A display apparatus, such as an organic light-emitting display apparatus including a self-illuminating element, is increasingly applied not only to typical electronic devices such as TVs but also in various other fields, for example, as various parts of vehicles, such as an instrument panel, a windshield, a display of a mirror, and indoor and outdoor light guide plates. In this case, it is required to optimize each display apparatus for the use environment thereof.

SUMMARY

Accordingly, embodiments of the present disclosure are directed to a display apparatus that substantially obviates one or more problems due to limitations and disadvantages of the related art.

The present disclosure has been provided to solve the problems described above, and an aspect of the present disclosure is to provide a display apparatus suitable for a vehicle, which exhibits a uniform display function while overcoming the harsh environment inherent to a vehicle. These days, the range of fields in which a display apparatus is used is expanding. For example, in recently developed vehicles, not only instrument panels but also infotainment systems such as a navigation system have been replaced by display apparatuses. However, due to the characteristics of a vehicle, a display apparatus is exposed to the external environment. In particular, a display apparatus embedded in a dashboard, which is located adjacent to an engine compartment, which dissipates high-temperature heat, may be subjected to extreme temperatures. The heat generated by drivers or other components included in a display apparatus may not be sufficiently dissipated, but may remain near the display apparatus. Such high temperatures may cause electronic devices such as drivers to malfunction, resulting in abnormal operation of the display screen.

In addition, while the vehicle is traveling, vibration or foreign substances may cause damage to electronic devices included in the display apparatus. Foreign substances generated in the vehicle may adhere to a printed circuit board, on which electronic devices such as drivers included in the display apparatus are disposed. The foreign substances adhered to the printed circuit board may be electrically conductive, which may thus lead to an electrical short in the printed circuit board.

In order to solve the above problems, another aspect of the present disclosure is to provide a display apparatus including a member enabling sufficient dissipation of heat generated in components and high resistance to vibration.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus may comprise a heat dissipation sheet and a guide plate disposed on the rear surface of a display panel, a printed circuit board disposed on one surface of the guide plate, a component disposed on one surface of the printed circuit board, and an intermediate plate disposed adjacent to the guide plate. The guide plate may include a bent extended portion and a coupling portion, and the bent extended portion may not be in contact with the heat dissipation sheet.

In another aspect, a display apparatus may comprise an intermediate plate disposed on the rear surface of a display panel, a guide plate disposed between the display panel and the intermediate plate, a printed circuit board disposed between the guide plate and the intermediate plate, and a heat dissipation sheet disposed between the display panel and the guide plate. The guide plate may include an extended portion, and the extended portion may not be in contact with the heat dissipation sheet.

It is to be understood that both the foregoing general description and the following detailed description of the disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
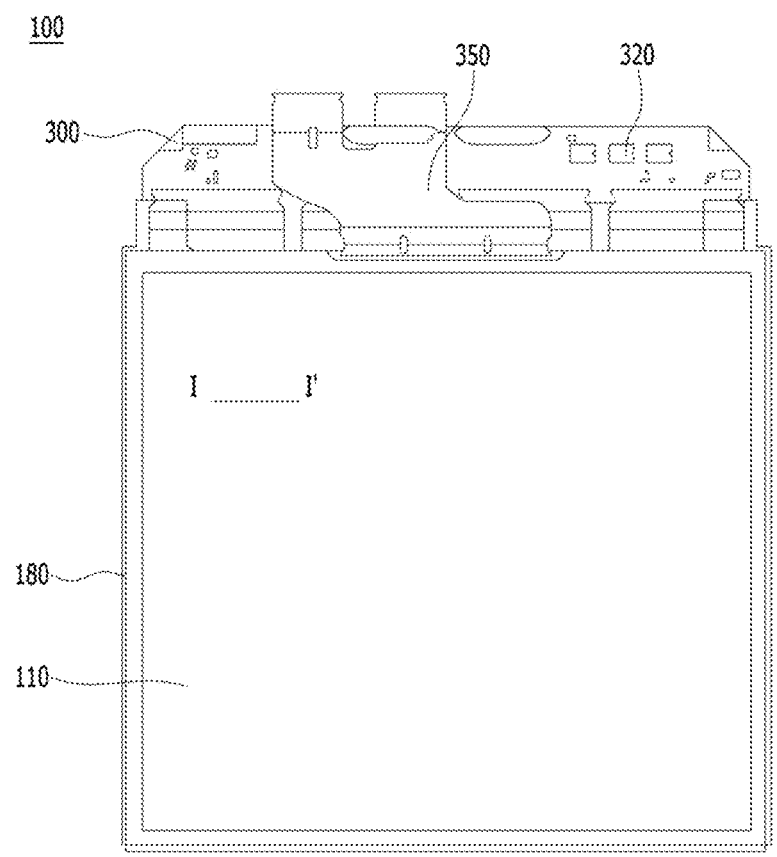
FIG. 1 is a plan view showing the front surface of a display apparatus.

Advantages and features of the present disclosure and methods for achieving the same will be made clear from the embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete and will fully convey the scope of the present disclosure to those skilled in the art. The present disclosure is defined only by the scope of the claims.

In the drawings for explaining the exemplary embodiments of the present disclosure, for example, the illustrated shape, size, ratio, angle, and number are given by way of example, and thus do not limit the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes", and/or "has", used in this specification, do not preclude the presence or addition of other elements unless used along with the term "only". Singular forms are intended to include the plural forms as well, unless the context clearly indicates otherwise.

In the interpretation of constituent elements included in the various embodiments of the present disclosure, the constituent elements are to be interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts, unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession, unless the term "directly" or "just" is used therewith.

In the description of the various embodiments of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second", without exceeding the technical scope of the present disclosure, unless otherwise mentioned.

Additionally, terms such as "first", "second", "A", "B", "(a)", "(b)", etc. may be used herein to describe the components of the embodiments. These terms are only used to distinguish one element from another element, and the essence, order, or sequence of corresponding elements is not limited by these terms. It should be noted that when it is described in the specification that one component is "connected", "coupled", or "joined" to another component, the former may be directly "connected", "coupled", or "joined" to the latter, intervening components may be present, or the former may be indirectly "connected", "coupled", or "joined" to the latter via yet another component.

In the description of the present disclosure, examples of a display apparatus may include a display apparatus in the narrow sense, such as a liquid crystal module (LCM), an organic light-emitting display (OLED) module, or a quantum dot (QD) module, which includes a display panel and a driver for driving the display panel. Further examples of the display apparatus may include a set device (or a set apparatus) or a set electronic apparatus, such as a laptop computer, a television, a computer monitor, an equipment apparatus including an automotive display or other type of vehicular apparatus, or a mobile electronic apparatus such as a smartphone or an electronic pad, which is a complete product (or a final product), including an LCM, an OLED module, or a QD module.

Therefore, in the description of the present disclosure, examples of the display apparatus may include a display apparatus itself in the narrow sense, such as an LCM, an OLED module, or a QD module, and a set apparatus, which is an application product or a final consumer apparatus including the LCM, the OLED module, or the QD module.

In some cases, an LCM, an OLED module, or a QD module, which includes a display panel and a driver, may be referred to as a "display apparatus in the narrow sense", and an electronic apparatus that is a final product including an LCM, an OLED module, or a QD module may be referred to as a "set apparatus". For example, the display apparatus in the narrow sense may include a display panel, such as an LCD, an OLED, or a QD, and a source printed circuit board (PCB), which is a controller for driving the display panel. The set apparatus may further include a set PCB, which is a set controller electrically connected to the source PCB to control the entirety of the set apparatus.

A display panel applied to the embodiment may use any type of display panel, such as a liquid crystal display panel, an organic light-emitting diode (OLED) display panel, a quantum dot (QD) display panel, or an electroluminescent display panel, but is not limited thereto, and may be applied to any type of display panel that is capable of realizing bezel bending using a flexible substrate for an OLED display panel of the embodiment and an underlying backplate support structure. Further, the shape or size of a display panel applied to a display apparatus according to the embodiment of the present disclosure is not particularly limited.

For example, when the display panel is an OLED display panel, the display panel may include a plurality of gate lines, a plurality of data lines, and a plurality of pixels respectively provided in a plurality of pixel areas defined by intersections of the gate lines and the data lines. In addition, the display panel may include an array including a thin-film transistor, which is an element for selectively applying a voltage to each of the pixels, an OLED layer on the array, and an encapsulation substrate or an encapsulation layer disposed on the array to cover the OLED layer. The encapsulation layer may protect the thin-film transistor and the OLED layer from external impacts, and may prevent moisture or oxygen from permeating the OLED layer. In addition, a layer provided on the array may include an inorganic light-emitting layer, e.g. a nano-sized material layer, a quantum dot, or the like.

An organic light-emitting diode (OLED) display panel is illustrated by way of example in FIG. 1 as a display panel that is capable of being integrated with display apparatuses, but the present disclosure is not limited thereto.

FIG. 1 is a view showing a display apparatus 100 according to an embodiment of the present disclosure.

Referring to FIG. 1, the display apparatus 100 may have a rectangular or square shape, and may be applied to a center fascia of a vehicle. The shape of the display apparatus 100 is not necessarily limited to a quadrangular shape, but the display apparatus 100 may be formed in any of various other shapes, such as a polygonal shape or a shape having a curved portion.

Referring to FIG. 1, the display apparatus 100 has a display function and a touch function that are integrated. A cover member 180 is provided at the front side of the display apparatus 100. A panel 110 for the display function may be disposed on the rear surface of the cover member 180. A touch circuit board 510 for the touch function may be disposed at a lower side. The display apparatus 100 may be inserted into and disposed in the dashboard of a vehicle. The panel 110 may be implemented as a substrate formed of a rigid material. However, in the case of an OLED, the panel 110 may be implemented as a flexible substrate. When implemented as a flexible substrate, the panel 110 is capable of being deformed concavely or convexly according to the shape of the dashboard. That is, the panel 110 is capable of being freely designed to match the shape of the dashboard. The cover member 180 may be a cover glass. Referring to FIG. 1, points A, B and C may be determined on the display apparatus 100. When the display apparatus 100 is turned on, the temperatures of respective parts may be measured at these points. The description of temperature measurement will be described later with reference to FIG. 6.

Figure 2:
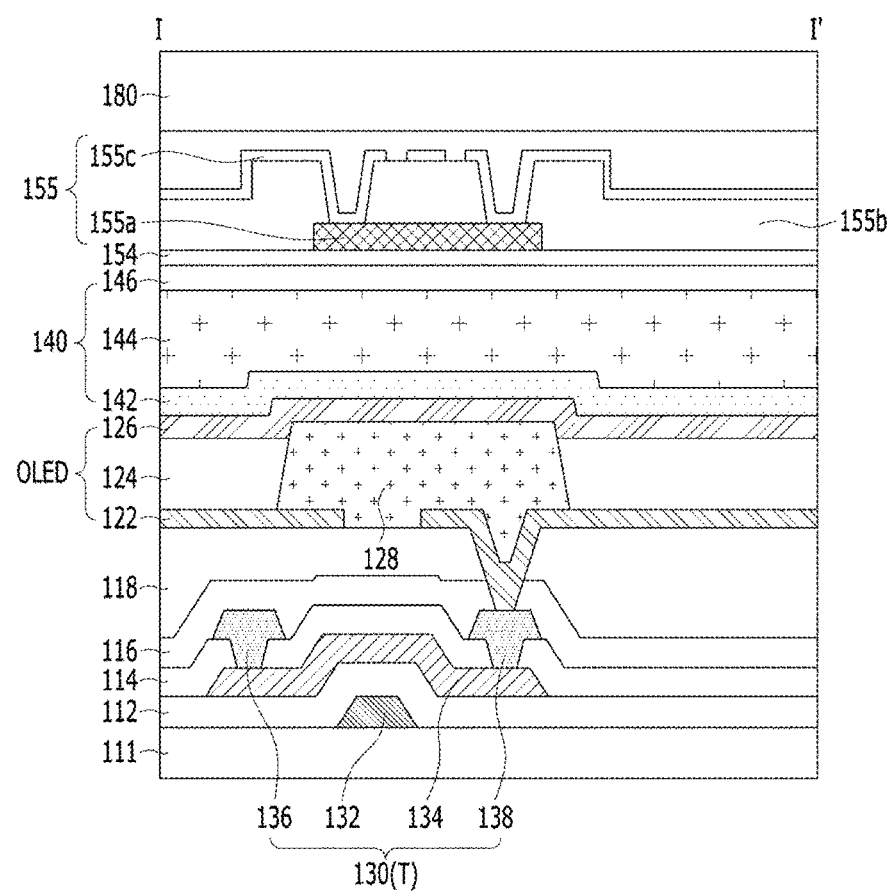
FIG. 2 is an enlarged cross-sectional view of a light-emitting element.

FIG. 2 shows a cross-sectional structure of the light-emitting element taken along line I-I' in FIG. 1. A substrate 111 may support various components of the panel 110. The substrate 111 may be formed of a transparent insulating material, e.g. glass or plastic. When the substrate 111 is formed of plastic, the substrate 111 may be referred to as a plastic film or a plastic substrate. For example, the substrate 111 may take the form of a film including one selected from the group consisting of a polyimide-based polymer, a polyester-based polymer, a silicon-based polymer, an acrylic polymer, a polyolefin-based polymer, and a copolymer thereof. Among these materials, polyimide may be applied to a high-temperature process and may be applied by coating, and thus is widely used for a plastic substrate.

A buffer layer may be located on the substrate 111. The buffer layer may protect the thin-film transistor (TFT) from impurities, such as alkali ions, discharged from the lower side of the substrate 111. The buffer layer may be formed of silicon oxide (SiOx), silicon nitride (SiNx), or multiple layers thereof, without being necessarily limited thereto.

A thin-film transistor 130 may be disposed on the buffer layer. The thin-film transistor 130 may have a structure in which a gate electrode 132, a gate-insulating film 112, a semiconductor layer 134, an interlayer insulating film 114, and source and drain electrodes 136 and 138 are sequentially stacked. At least one thin-film transistor 130 may be disposed in a plurality of subpixels provided in an active area.

The thin-film transistor 130 shown in FIG. 2 is of a bottom-gate type, without being necessarily limited thereto. A top-gate type, in which the sequence in which the semiconductor layer 134 and the gate electrode 132 are formed is reversed, may also be applied.

The semiconductor layer 134 may be disposed on a specific portion of the substrate 111 or the buffer layer. The semiconductor layer 134 may be formed of polysilicon (p-Si). In this case, a predetermined area in the semiconductor layer 134 that needs to be an electrode layer may be doped with an impurity. Further, the semiconductor layer 134 may be formed of amorphous silicon (a-Si), or may be formed of various organic semiconductor materials such as pentacene. Alternatively, the semiconductor layer 134 may be formed of oxide. The gate-insulating film 112 may be formed of an insulating inorganic material such as silicon oxide (SiOx) or silicon nitride (SiNx), or may be formed of an insulating organic material or the like. The gate electrode 132 may be formed of various conductive materials such as magnesium (Mg), aluminum (Al), nickel (Ni), chromium (Cr), molybdenum (Mo), tungsten (W), gold (Au), or alloys thereof, without being necessarily limited thereto.

The first interlayer insulating film 114 may be formed of an insulating material such as silicon oxide (SiOx) or silicon nitride (SiNx), or may be formed of an insulating organic material or the like. A contact hole, through which source and drain regions are exposed, may be formed by selectively removing the first interlayer insulating film 114.

The source and drain electrodes 136 and 138 may be formed of an electrode material in a single-layered or multi-layered structure on the first interlayer insulating film 114.

An inorganic protective film 116 and a planarization layer 118 may be located on the thin-film transistor while covering the source and drain electrodes 136 and 138. The inorganic protective film 116 and the planarization layer 118 protect the thin-film transistor and flatten the upper portion of the same. The inorganic protective film 116 may be formed as an inorganic insulating film such as a silicon nitride (SiNx) film or a silicon oxide (SiOx) film, and the planarization layer 118 may be formed as an organic insulating film such as a benzocyclobutene (BCB) film or an acrylic film. Each of the inorganic protective film 116 and the planarization layer 118 may be formed in a single-layered, double-layered, or multi-layered structure. Any one of the inorganic protective film 116 and the planarization layer 118 may be omitted.

The light-emitting element, which is connected to the thin-film transistor (TFT) 130, may have a structure in which a first electrode 122, an organic light-emitting layer 124, and a second electrode 126 are sequentially stacked. That is, the light-emitting element may include the first electrode 122, which is connected to the drain electrode 138 through a connection hole 148 formed in the planarization layer 118 and the inorganic protective film 116, the organic light-emitting layer 124, which is located on the first electrode 122, and the second electrode 126, which is located on the organic light-emitting layer 124.

When the display panel 110 is of a top-emission type, in which light is radiated toward the region above the second electrode 126, the first electrode 122 may include an opaque conductive material having high reflectivity. The reflective conductive material may be, for example, silver (Ag), aluminum (Al), gold (Au), molybdenum (Mo), tungsten (W), chromium (Cr), or alloys thereof, without being necessarily limited thereto.

A bank 128 may be formed in the remaining region except for the emission region so as to open the emission region. Accordingly, the bank 128 has therein a bank hole that exposes a portion of the first electrode 122 that corresponds to the emission region. The bank 128 may be formed of an inorganic insulating material, such as silicon nitride (SiNx) or silicon oxide (SiOx), or an organic insulating material such as BCB, acrylic-based resin or imide-based resin.

The organic light-emitting layer 124 is located on the portion of the first electrode 122 that is exposed by the bank 128. The organic light-emitting layer 124 may include a hole injection layer, a hole transport layer, a light-emitting layer, an electron transport layer, an electron injection layer, and the like. The organic light-emitting layer 124 may have a single light-emitting layer structure that emits a single light beam in a single stack, or may have a multiple-stack structure that includes multiple stacks and a single light-emitting layer of the same color in each stack. In this case, in order to display various colors, the subpixels may be arranged such that neighboring subpixels emit different colored light beams. For example, subpixels having red, green and blue light-emitting layers may be sequentially arranged side by side, or may be disposed so as to be spaced apart from each other. In particular, subpixels of a specific color may be arranged parallel to each other and the other subpixels may be disposed in diagonal directions so as to have a triangular-shaped or PenTile structure.

In another example, subpixels for a white color may be further disposed. Alternatively, the organic light-emitting layer 124 may have an arrangement structure for displaying a white color by stacking multiple stacks including light-emitting layers emitting different colored light beams. In the case of displaying a white color using a stack structure, a separate color filter may be further provided in each subpixel.

The second electrode 126 is located on the organic light-emitting layer 124. When the display panel 110 is of a top-emission type, the second electrode 126 may be formed of a transparent conductive layer such as indium tin oxide (ITO) or indium zinc oxide (IZO), or may be formed of a semi-permeable metal or metal alloy such as magnesium-silver alloy (MgAg). Thus, the second electrode 126 may radiate light generated in the organic light-emitting layer 124 toward the region above the second electrode 126.

A capping layer may be disposed above the second electrode 126. The capping layer may protect the light-emitting element, and may be formed of a material having a high refractive index, thereby helping extract the light radiated from the second electrode 126.

An encapsulation layer 140 may be disposed on the light-emitting element. The encapsulation layer 140 is configured to prevent permeation of oxygen and moisture from the outside in order to prevent oxidation of light-emitting material and electrode material. When the light-emitting element is exposed to moisture or oxygen, a pixel shrinkage phenomenon, in which the size of the emission region is reduced, may occur, or a dark spot may be formed in the emission region. The encapsulation layer 140 may be formed by alternately stacking inorganic films 142 and 146, which are formed of glass, metal, aluminum oxide (AlOx), or silicon (Si)-based material, and an organic film 144, which serves to mitigate stress between the respective layers due to bending of the display panel 110 and to enhance planarization performance. The organic film 144 may be formed of an organic insulating material such as acrylic resin, epoxy resin, polyimide, polyethylene, or silicon oxy-carbon (SiOC). The first and second inorganic films 142 and 146 serve to prevent the permeation of moisture or oxygen, and the organic film 144 serves to flatten the surface of the first inorganic film 142. When the encapsulation layer 140 is formed as multiple thin films, it makes the permeation path of moisture or oxygen long and complicated compared to that when formed as a single film, thereby making it difficult for moisture/oxygen to permeate to the light-emitting element.

A protective layer may be further formed between the light-emitting element and the encapsulation layer 140. The protective layer may protect the encapsulation layer 140, so that the side surface of the encapsulation layer 140 is not peeled off or the uniformity thereof is not affected during the process of forming the encapsulation layer 140.

Referring to FIG. 2, a polarization layer 154 may be disposed on the encapsulation layer 140. The polarization layer 154 may minimize the influence that the light generated by an external light source has on the semiconductor layer 134 or the light-emitting layer 124 when traveling into the panel 110.

Referring to FIG. 2, a touch sensor layer 155 may be disposed on the polarization layer 154. The touch sensor layer 155 may have a structure in which a first touch electrode 155a and a second touch electrode 155c, one of which receives a voltage signal and the other one of which senses a voltage signal, cross each other. The first touch electrode 155a and the second touch electrode 155c may be patterned in a polygonal or circular shape on a touch insulating film 155b, and may be spaced apart from each other.

A cover member 180 may be disposed on the touch sensor layer 155. An adhesive layer may be further disposed between the touch sensor layer 155 and the cover member 180 so that the touch sensor layer 155 and the cover member 180 are bonded to each other.

Figure 3A:
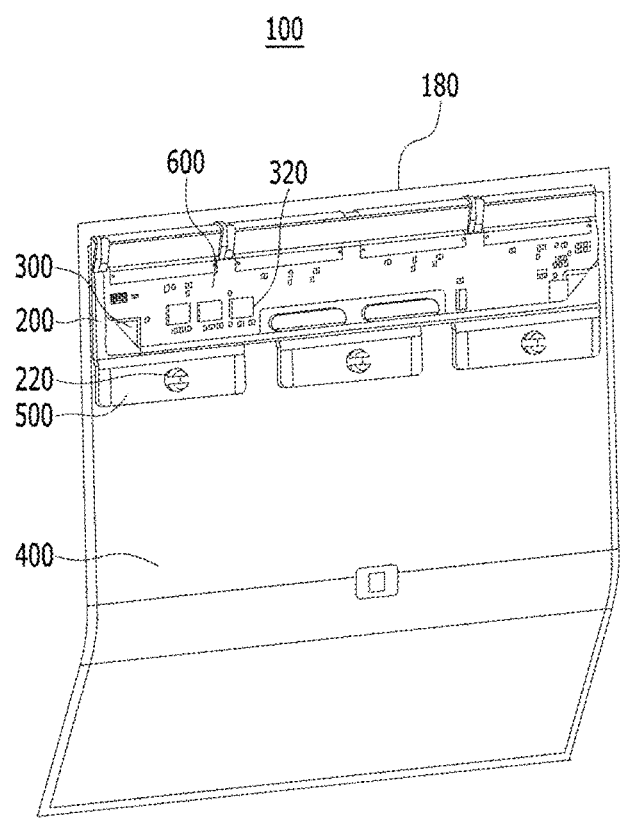
FIGS. 3A and 3B are perspective views showing the rear surface of the display apparatus of FIG. 1 and an intermediate plate thereof.
Figure 3B:
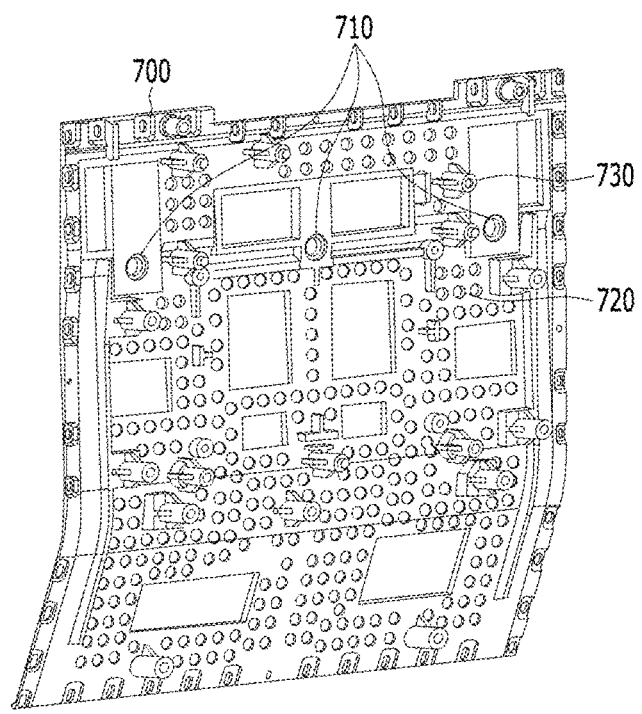

FIGS. 3A and 3B are views showing the rear surface of the display apparatus 100 of FIG. 1 and an intermediate plate thereof.

The panel 110 may be disposed on the rear surface of the cover member 180, and a heat dissipation sheet 400 may cover the entirety or a portion of the rear surface of the panel 110. The heat dissipation sheet 400 may be configured such that heat generated in the panel 110 is conducted thereto and is dissipated to the air. A guide plate 200 may cover the entirety or a portion of the rear surfaces of the panel 110 and the heat dissipation sheet 400. The guide plate 200 may be bonded to the rear surface of the panel 110 or the rear surface of the heat dissipation sheet 400 to support the panel 110. An intermediate plate 700 may be provided with a protrusion 730, by which the display apparatus 100 including the panel 110 and the cover member 180 is capable of being inserted into and fixed to the dashboard of the vehicle via the intermediate plate 700. The guide plate 200 may be provided with a coupling portion 220 so as to be coupled to the intermediate plate 700. The guide plate 200 may be a first plate. The intermediate plate 700 may be a second plate. The coupling portion 220 may be a connection portion. The coupling portion 220 may have a structure that protrudes so as to be fitted in a coupling hole 710 formed in the intermediate plate 700. The coupling hole 710 may be a connection hole. As shown in FIG. 3, three coupling portions 220 may be disposed at three points so that the display apparatus 100 is held in a balanced manner. However, the present disclosure is not limited to any particular number of coupling portions 220 or to the positions thereof. A heat-conductive tape 500 may be disposed in an area adjacent to the coupling portion 220 so as to come into contact with the intermediate plate 700. The heat-conductive tape 500 may be a thermally conductive member. The intermediate plate 700 may include a coupling hole 710, which is directly connected to the coupling portion 220, and heat dissipation holes 720 for increasing the surface area of the intermediate plate 700. The intermediate plate 700 may further include structures that are capable of being coupled to the dashboard. The guide plate 200 may have any of various planar structures according to the shape in which the display apparatus 100 is seated on the dashboard. For example, when the display apparatus 100 is required to form a concave plane on the dashboard, the panel 110 and the cover member 180 need to be fixed to and supported by the concave plane of the guide plate 200 in a concave shape. In order to fix and support the panel 110 and the cover member 180, the guide plate 200 may be formed of a metal material, such as magnesium, copper or aluminum, or a plastic material such as polycarbonate. When the display apparatus is inserted into the dashboard, workability may be improved by fixing a printed circuit board 300 to the guide plate 200. For example, when the printed circuit board 300 is not fixed, the printed circuit board 300 may be separated during the assembly process. In order to protect the printed circuit board 300, a cover shield 600 may be attached to the printed circuit board 300. The cover shield 600 prevents exposure of the printed circuit board 300, thereby preventing an electrical short attributable to moisture or foreign substances and protecting the printed circuit board 300 from external physical force. In addition, in order to supply a signal or power to the printed circuit board 300 from the outside, a flexible printed circuit board 350 is attached to the printed circuit board 300.

The intermediate plate 700 is connected to the guide plate 200, and serves not only to fix the panel 110 but also to dissipate the heat generated from a component 320 disposed on the printed circuit board 300 of the panel 110. The component 320 may be a driver integrated circuit (IC) or a circuit chip. For example, the printed circuit board 300 may be fixed to a portion of the rear surface of the guide plate 200. Thus, the guide plate 200 may dissipate the heat generated from the panel 110 and the printed circuit board 300. When the panel 110 is driven, heat may be generated from the light-emitting element when light is emitted therefrom. When this heat remains in the panel 110, this may cause a problem of abnormal colors. Further, when heat is generated from the component 320 used to drive the panel 110 and remains in the printed circuit board 300, driving power consumption may increase, or the light-emitting element may be damaged. The cover member 180 may be formed of a glass or plastic material having low thermal conductivity. Thus, heat from the panel 110 or the printed circuit board 300 may not be dissipated to the front side, but may be transferred to the guide plate 200 disposed at the back side. The heat transferred to the guide plate 200 may be dissipated through the intermediate plate 700, which has a greater volume than the guide plate 200, and thus an increase in the temperature of the panel 110 and the printed circuit board 300 may be minimized. The intermediate plate 700 may have a size corresponding to that of the display apparatus 100. The intermediate plate 700 may be disposed so as to be in direct contact with or to overlap the heat dissipation sheet 400, which is disposed on the rear surface of the panel 110, and may support the panel 110. The heat dissipation sheet 400 may be a heat dissipation member. In order to support the panel 110, the intermediate plate 700 may be formed of a metal material, such as copper, iron or aluminum, or a plastic material. When the intermediate plate 700 is formed of a metal material, the heat dissipation effect described above may be improved.

Referring to FIG. 3B, the intermediate plate 700 may have a plurality of heat dissipation holes 720 formed therein to increase the surface area thereof and realize smooth air circulation.

Figure 3C:
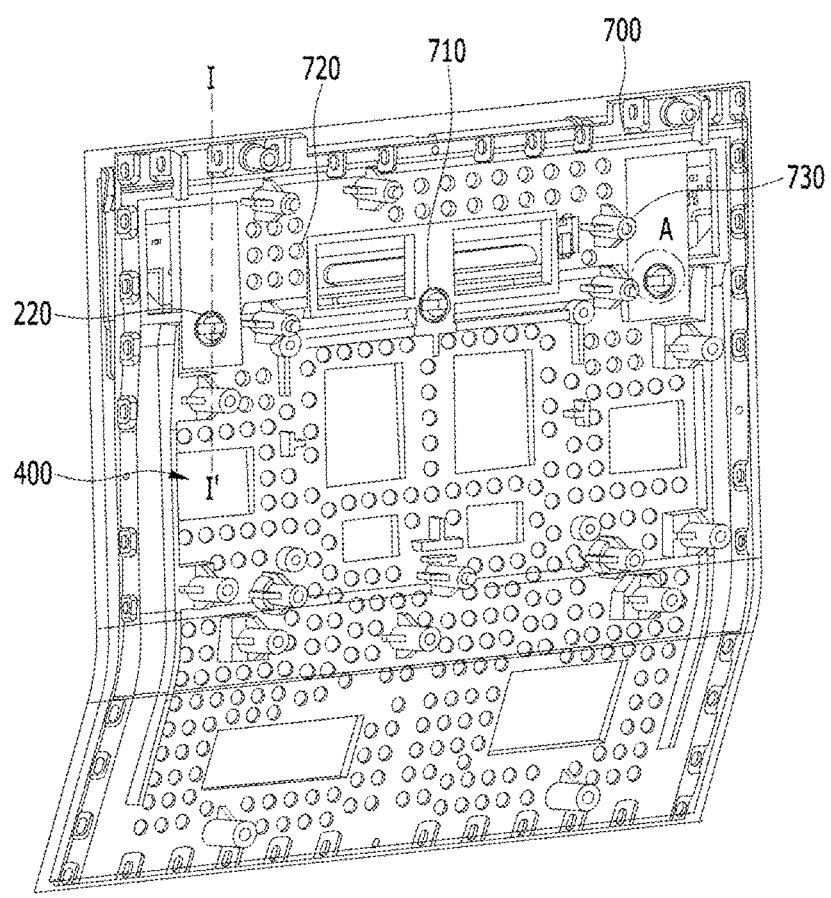
FIG. 3C is a perspective view showing the coupled state of the display apparatus and the intermediate plate of FIGS. 3A and 3B.

FIG. 3C is a view showing the coupled state of the display apparatus 100 and the intermediate plate 700 of FIGS. 3A and 3B. Referring to FIG. 3C, the coupling portion 220 may be inserted into or accommodated in the coupling hole 710 in the intermediate plate 700 to be coupled thereto. The heat dissipation holes 720 may be evenly distributed in a large area of the intermediate plate 700 so that the heat from the heat dissipation sheet 400 disposed on the rear surface of the panel 110 smoothly circulates in the air. The intermediate plate 700 may include a protrusion 730 to be coupled to the dashboard. The intermediate plate 700 may serve not only to couple the panel 110 to the dashboard but also to improve the durability of the panel 110. Because a vehicle is easily influenced by the external temperature and vibrations occur in many directions during travel of the vehicle, it is important to increase the durability of the display apparatus 100. Heat and vibration applied to the panel 110 may be absorbed by the intermediate plate 700 supporting the panel 110.

Figure 4:
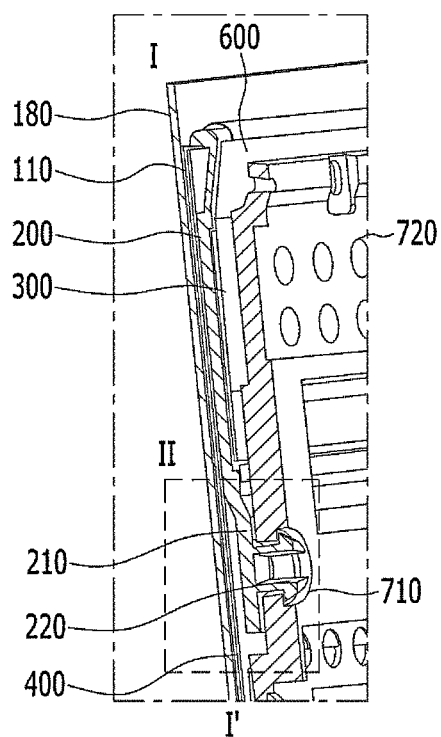
FIG. 4 is a cross-sectional view taken along line I-I' in FIG. 3.

FIG. 4 is a view showing the cross-sectional structure taken along line I-I' in FIG. 3.

Referring to FIG. 4, the panel 110 may be disposed on the rear surface of the cover member 180, and the heat dissipation sheet 400 and the guide plate 200 may be disposed on the rear surface of the panel 110. The heat dissipation sheet 400 may dissipate the heat generated in the panel 110, and may transfer a portion of the generated heat to the guide plate 200 adjacent thereto. The heat dissipation sheet 400 may be formed of a material having high thermal conductivity, such as copper or graphite. The printed circuit board 300 may be disposed on the guide plate 200 so as to be bonded thereto, and the cover shield 600 may be disposed on the printed circuit board 300 to protect the same.

The guide plate 200 may include a bent extended portion 210 and a coupling portion 220. The bent extended portion 210 may extend from the guide plate 200 toward the intermediate plate 700, and the coupling portion 220 may be disposed at the end of the bent extended portion 210. The bent extended portion 210 may function to place the coupling portion 220 close to the intermediate plate 700 so that the coupling portion 220 is easily connected to the intermediate plate 700. In addition, the bent extended portion 210 may absorb shocks that may occur during the process of connecting the panel 110 to the intermediate plate 700 or the process of mounting the intermediate plate 700, which is coupled to the panel 110, to the dashboard of the vehicle. In addition, the bent extended portion 210 may absorb vibrations that may occur during travel of the vehicle, thereby preventing the panel 110 or the heat dissipation sheet 400 from being damaged. The coupling portion 220 may be formed to correspond to the coupling hole 710 in the intermediate plate 700, and may be coupled thereto. The coupling portion 220 and the coupling hole 710 may be coupled in a hook manner. For example, the coupling portion 220 may be pushed into and fixed by the coupling hole 710. The hook-coupling manner may enable simplification of the coupling process and stable maintenance of the fixed state.

Referring to FIG. 4, a plurality of heat dissipation holes 720 may be disposed in the intermediate plate 700 so that the heat generated from the heat dissipation sheet 400 is dissipated through air convection. In addition, the intermediate plate 700 may increase in surface area due to the heat dissipation holes 720 formed therein, and thus the heat dissipation function of the intermediate plate 700 itself may be improved. The bent extended portion 210 may be referred to as an extended portion or a curved extended portion, but is not limited to any particular term.

Figure 5:
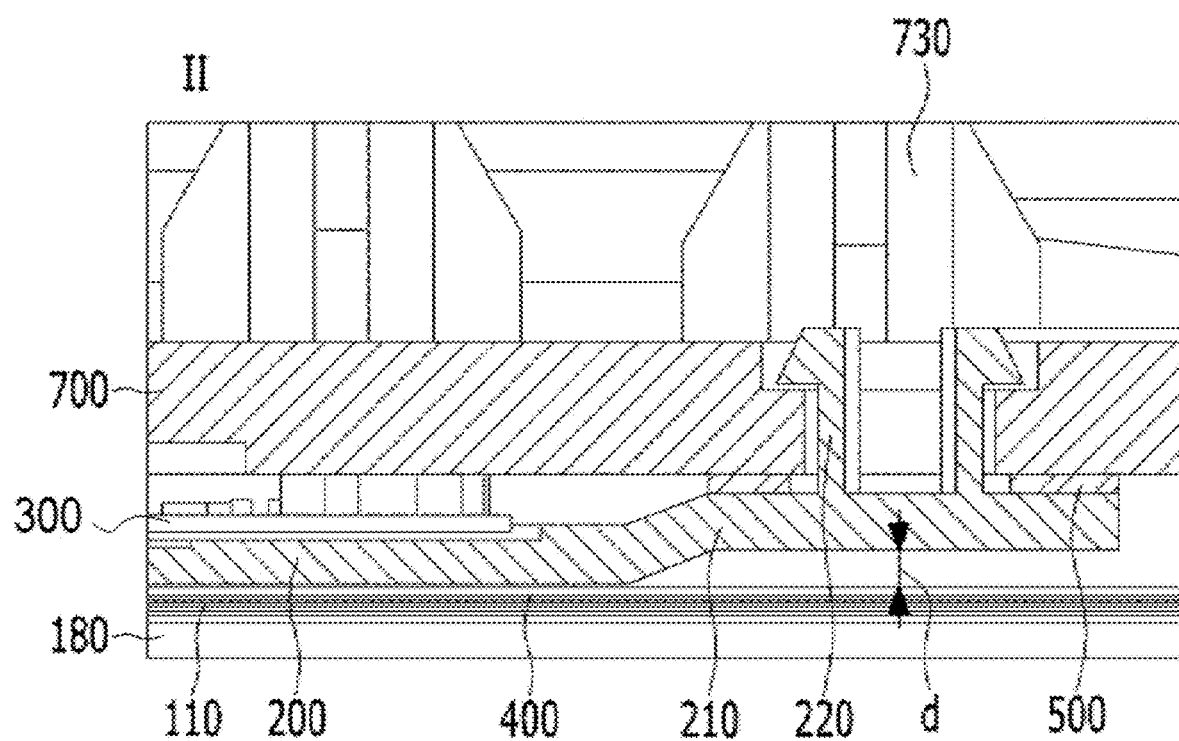
FIG. 5 is an enlarged cross-sectional view of portion II in FIG. 4.

FIG. 5 is an enlarged cross-sectional view of portion II in FIG. 4.

Referring to FIG. 5, the cover member 180, the panel 110, and the heat dissipation sheet 400 are sequentially disposed. The guide plate 200 is disposed so as to be in contact with the heat dissipation sheet 400, and the bent extended portion 210 of the guide plate 200 has a structure that is spaced apart from the heat dissipation sheet 400 by a predetermined distance d and is bent close to the intermediate plate 700. The spacing distance d may range from about 1 mm to about 2 mm, or may be 1.5 mm, without being necessarily limited thereto. When the spacing distance d is less than 1 mm, the bent section of the bent extended portion 210 is shortened, and it is thus difficult to secure sufficient space in which the bent extended portion 210 of the guide plate 200 is bent when the intermediate plate 700 is coupled to the guide plate 200, whereby shocks are directly applied to the heat dissipation sheet 400 and the panel 110. When the spacing distance d is greater than 2 mm, the bent section of the bent extended portion 210 is lengthened, and thus shock-absorbing performance may be deteriorated, or the bent extended portion 210 may be deformed. The coupling portion 220 may be disposed at the end of the bent extended portion 210, and may be connected to the coupling hole 710 in the intermediate plate 700. The reason for spacing the bent extended portion 210 apart from the heat dissipation sheet 400 by a predetermined distance is to secure smooth coupling of the coupling portion 220 and the coupling hole 710 when the guide plate 200 is coupled to the intermediate plate 700. The bent extended portion 210 may place the coupling portion 220 close to the intermediate plate 700 so that the coupling portion 220 is easily connected to the intermediate plate 700. In addition, the bent extended portion 210 may absorb shocks, which may occur during the process of connecting the panel 110 to the intermediate plate 700 or the process of mounting the intermediate plate 700, which is coupled to the panel 110, to the dashboard of the vehicle. In addition, in state in which the intermediate plate 700 is coupled to the dashboard of the vehicle, the bent extended portion 210 may absorb some of the vibrations that are transferred from the vehicle to the intermediate plate 700 and the guide plate 200.

Referring to FIG. 5, the heat-conductive tape 500 may be disposed between the coupling hole 710 and each of the bent extended portion 210 and the coupling portion 220. The heat-conductive tape 500 may help maintain stable contact between the bent extended portion 210 and the portion of the intermediate plate 700 that is adjacent to the coupling hole 710. The heat-conductive tape 500 may serve as an intermediate medium, via which heat is efficiently dissipated through the guide plate 200 and the intermediate plate 700. The heat-conductive tape 500 may be formed of a material having high thermal conductivity, such as graphite or copper. When the heat-conductive tape 500 is configured as elastic foam tape, it may further increase the shock-absorbing effect together with the bent extended portion 210.

Figures 6, 7:
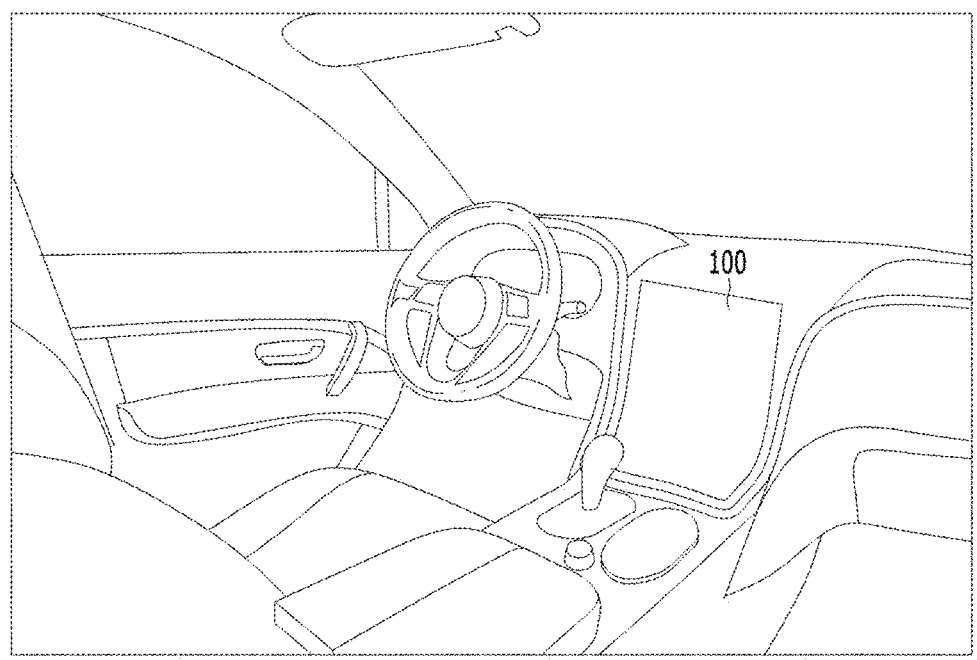
FIG. 6 is a table showing the results of tests performed on an experimental example and the embodiment of the present disclosure.
FIG. 7 is a view showing the interior of a vehicle to which the display apparatus according to the embodiment of the present disclosure is applied.

FIG. 6 shows the results of tests for measuring the surface temperature of the display screen to which the embodiment shown in FIGS. 4 and 5 is applied.

Referring to FIG. 6, tests were conducted under three conditions, namely an experimental example, Embodiment 1, and Embodiment 2. In order to measure the temperature of the display screen, thermal imaging was performed, and contact-type temperature measurement was performed on three points of the display screen. In the experimental example, the guide plate 200 was formed of polycarbonate (PC), which is inexpensive and has good formability, and the bent extended portion 210 and the coupling portion 220 were not applied to the guide plate 200. That is, the guide plate 200 was connected to the intermediate plate 700 using an adhesive tape without the bent extended portion 210 and the coupling portion 220. In Embodiment 1, the guide plate 200 was formed of the same material as that of the reference, and was connected to the intermediate plate 700 by applying the bent extended portion 210, the coupling portion 220, and the heat-conductive tape 500 to the guide plate 200. In Embodiment 2, the guide plate 200 was formed of magnesium (Mg), which has higher thermal conductivity, and was connected to the intermediate plate 700 by applying the bent extended portion 210, the coupling portion 220, and the heat-conductive tape 500 to the guide plate 200.

Referring to FIG. 6, the first set of experimental data is thermal imaging data, in which a relatively dark display region indicates a relatively high-temperature region, and a relatively light display region indicates a relatively low-temperature region. It can be appreciated from the thermal imaging data of the experimental example that heat is concentrated in the upper region of the display screen. It can be anticipated that the printed circuit board 300 and the component 320 are concentrated on the rear surface of the corresponding region and that the heat generated in the component 320 is dissipated to the display screen. It can be appreciated from the thermal imaging data that the heat concentration in the upper region of the display screen in Embodiment 1 is lowered below that in the experimental example. For example, it can be appreciated that a reduction in the temperature of the regions corresponding to the bent extended portion 210 and the coupling portion 220 appears as a line. It can be appreciated from the thermal imaging data that the temperature of the upper region of the display screen in Embodiment 2 is lower than that in Embodiment 1.

Referring to FIG. 6, the second set of experimental data is the result of performing contact-type temperature measurement on three points of the surface of the cover member 180 and one arbitrary point in the highest-temperature region determined based on the thermal imaging data. The three temperature measurement points correspond to points A, B and C. The highest temperature in the experimental example was about 45.52° C., the highest temperature in Embodiment 1 was about 44.88° C., and the highest temperature in Embodiment 2 was about 44.21° C. Thus, it can be appreciated that the highest temperature in Embodiment 2 was about 1.31° C. lower than in the experimental example. In addition, it can be appreciated that the temperature of point A in Embodiment 2, which represents the temperature of the upper region of the display screen on which the printed circuit board 300 and the component 320 are concentrated, was about 1.56° C. lower than in the experimental example. As a result, Embodiment 2 may exhibit the effects of reduced power consumption and prevention of damage to the elements of the panel 110 due to effective dissipation of heat from the printed circuit board 300 and the component 320 disposed on the printed circuit board 300.

FIG. 7 is a view showing the vehicle in which the display apparatus according to the embodiment of the present disclosure is mounted.

The display apparatus 100 may be inserted into or accommodated in the dash board or the center fascia of the vehicle so that a driver or a passenger is capable of using an infotainment system.

The display apparatus according to the embodiment of the present disclosure includes a liquid crystal display (LCD) apparatus, a field emission display (FED) apparatus, an organic light-emitting display (OLED) apparatus, and a quantum dot display apparatus.

The display apparatus according to the embodiment of the present disclosure may include a set device (or a set apparatus) or a set electronic apparatus, such as a laptop computer, a television, a computer monitor, an equipment apparatus including an automotive display or other type of vehicular apparatus, or a mobile electronic apparatus such as a smartphone or an electronic pad, which is a complete product (or a final product), including an LCM or an OLED module.

The display apparatus according to the embodiment of the present disclosure may be explained as follows.

A display apparatus according to an embodiment of the present disclosure may include a heat dissipation sheet and a first plate disposed on the rear surface of a display panel, a printed circuit board disposed on one surface of the first plate, a component disposed on one surface of the printed circuit board, and a second plate disposed adjacent to the first plate. The first plate may include a bent extended portion and a coupling portion, and the bent extended portion may not be in contact with the heat dissipation sheet.

In the display apparatus according to the embodiment of the present disclosure, the coupling portion may be disposed on a first surface of the bent extended portion, and a second surface of the bent extended portion may face the heat dissipation sheet while being spaced apart therefrom.

In the display apparatus according to the embodiment of the present disclosure, the second plate may include a coupling hole formed therein.

In the display apparatus according to the embodiment of the present disclosure, the coupling hole and the coupling portion may be connected to each other such that the second plate and the guide plate are connected to each other.

The display apparatus according to the embodiment of the present disclosure may further include a heat-conductive tape disposed between the bent extended portion and the coupling hole.

In the display apparatus according to the embodiment of the present disclosure, the heat-conductive tape may be formed of at least one of graphite or copper.

In the display apparatus according to the embodiment of the present disclosure, the second plate may further include a heat dissipation hole formed therein and a protrusion.

In the display apparatus according to the embodiment of the present disclosure, the heat dissipation hole may expose the heat dissipation sheet to secure smooth air circulation.

A display apparatus according to another embodiment of the present disclosure may include a second plate disposed on the rear surface of a display panel, a first plate disposed between the display panel and the second plate, a printed circuit board disposed between the first plate and the second plate, and a heat dissipation sheet disposed between the display panel and the first plate. The first plate may include an extended portion, and the extended portion may not be in contact with the heat dissipation sheet.

In the display apparatus according to the embodiment of the present disclosure, the first plate may further include a coupling portion disposed on one surface of the extended portion, and the coupling portion may be located opposite the heat dissipation sheet with respect to the extended portion.

In the display apparatus according to the embodiment of the present disclosure, the second plate may include a coupling hole formed therein, and the coupling portion and the coupling hole may be coupled and fixed to each other.

In the display apparatus according to the embodiment of the present disclosure, the extended portion may be spaced apart from the heat dissipation sheet by about 1 mm to about 2 mm.

The display apparatus according to the embodiment of the present disclosure may further include a heat-conductive tape disposed between the extended portion and the second plate.

In the display apparatus according to the embodiment of the present disclosure, the heat-conductive tape may include copper or graphite.

In the display apparatus according to the embodiment of the present disclosure, the second plate may further include a heat dissipation hole formed therein and a protrusion.

In the display apparatus according to the embodiment of the present disclosure, the second plate may be formed of aluminum, and the first plate may be formed of magnesium.

As is apparent from the above description, in a display apparatus according to the embodiment of the present disclosure, a heat dissipation sheet is applied to the rear surface of a display panel, thereby efficiently dissipating heat generated in the panel, and a guide plate is disposed on the rear surface of the display panel so as to be in contact with a printed circuit board, thereby dissipating the heat generated by the printed circuit board.

According to the embodiment of the present disclosure, the guide plate includes a bent extended portion and a coupling portion, via which the guide plate is in contact with and connected to an intermediate plate, whereby the heat generated by the printed circuit board may be primarily dissipated through the guide plate and may be secondarily dissipated through the intermediate plate, to which the coupling portion is connected.

According to the embodiment of the present disclosure, a heat-conductive tape is disposed between the bent extended portion of the guide plate and the intermediate plate, whereby the heat transfer area between the bent extended portion and the intermediate plate may increase, and thus heat transfer from the guide plate to the intermediate plate may be more smoothly realized.

According to the embodiment of the present disclosure, a heat dissipation hole is formed in the intermediate plate, whereby air smoothly circulates through the heat dissipation hole, and thus the heat dissipation performance of the heat dissipation sheet may be improved.

However, the effects achievable through the disclosure are not limited to the above-mentioned effects, and other effects not mentioned herein will be clearly understood by those skilled in the art from the above description.

The features, structures, effects, and the like described in association with the embodiments above are incorporated into at least one embodiment of the present disclosure, but should not be construed to limit the disclosure only to the one embodiment. Furthermore, the features, structures, effects, and the like exemplified in association with respective embodiments can be implemented in other embodiments through combination or modification by those skilled in the art. Therefore, content related to such combinations and modifications should be construed as falling within the scope of the present disclosure.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
   a heat dissipation sheet and a first plate disposed on a rear surface of a display panel;
   a printed circuit board disposed on one surface of the first plate;
   a component disposed on one surface of the printed circuit board; a second plate disposed adjacent to the first plate; and
   a heat-conductive tape disposed between the first plate and the second plate,
   wherein the first plate comprises a bent extended portion and a coupling portion,
   wherein the bent extended portion is not in contact with the heat dissipation sheet,
   wherein the second plate comprises a coupling hole formed therein,
   wherein the coupling hole and the coupling portion are connected to each other such that the second plate and the first plate are connected to each other, and
   wherein the heat-conductive tape is disposed between the bent extended portion and the coupling hole.

2. The display apparatus according to claim 1, wherein the coupling portion is disposed on a first surface of the bent extended portion, and
   wherein a second surface of the bent extended portion faces the heat dissipation sheet while being spaced apart from the heat dissipation sheet.

3. The display apparatus according to claim 1, wherein the heat-conductive tape is formed of graphite or copper.

4. The display apparatus according to claim 1, wherein the second plate comprises a heat dissipation hole formed therein and a protrusion.

5. The display apparatus according to claim 4, wherein the heat dissipation hole exposes the heat dissipation sheet to secure smooth air circulation.

6. A display apparatus, comprising:
   a second plate disposed on a rear surface of a display panel;
   a first plate disposed between the display panel and the second plate;
   a printed circuit board disposed between the first plate and the second plate;
   a heat dissipation member disposed between the display panel and the first plate; and
   a heat-conductive tape disposed between the first plate and the second plate,
   wherein the first plate comprises an extended portion,
   wherein the extended portion is not in contact with the heat dissipation member,
   wherein the second plate comprises a coupling hole formed therein,
   wherein the coupling hole and the coupling portion are connected to each other such that the second plate and the first plate are connected to each other, and
   wherein the heat-conductive tape is disposed between the bent extended portion and the coupling hole.

7. The display apparatus according to claim 6, wherein the first plate further comprises a coupling portion disposed on one surface of the extended portion, and
   wherein the coupling portion is located opposite the heat dissipation member with respect to the extended portion.

8. The display apparatus according to claim 7, wherein the extended portion is spaced apart from the heat dissipation member by about 1 mm to about 2 mm.

9. The display apparatus according to claim 6, wherein the heat-conductive tape comprises copper or graphite.

10. The display apparatus according to claim 6, wherein the second plate comprises a heat dissipation hole formed therein and a protrusion.

11. The display apparatus according to claim 6, wherein the second plate is formed of aluminum, and
    wherein the first plate is formed of magnesium.

12. The display apparatus according to claim 1, further comprising:
    a cover member disposed on a front surface of the display panel.

13. The display apparatus according to claim 12, wherein the display panel, the first plate and the cover member are capable of being deformed concavely or convexly according to a shape of a dashboard of a vehicle.

14. The display apparatus according to claim 13, wherein the display panel, the first plate and the cover member have a concave plane.

15. The display apparatus according to claim 13, wherein the display panel and the cover member are fixed to and supported by the concave plane of the first plate in a concave shape.

* * * * *